United States Patent [19]

Lee

[11] Patent Number: 5,699,228
[45] Date of Patent: Dec. 16, 1997

[54] METHOD OF INTERCONNECTING LEADLESS DEVICES TO PRINTED WIRING BOARDS AND APPARATUS PRODUCED THEREBY

[75] Inventor: Jimmy K. Lee, Diamond Bar, Calif.

[73] Assignee: Hughes Electronics, Los Angeles, Calif.

[21] Appl. No.: 468,606

[22] Filed: Jun. 6, 1995

[51] Int. Cl.$^6$ ............................................. H05K 7/20
[52] U.S. Cl. .......................... 361/707; 257/707; 361/715; 439/66
[58] Field of Search .......................... 165/80.2, 80.3, 165/185; 174/16.3; 257/706, 707, 712, 713, 718, 719, 726, 727; 361/704, 707, 709, 710, 715–718, 722, 785; 439/66, 68, 71, 74, 487

[56] References Cited

U.S. PATENT DOCUMENTS

| | | | |
|---|---|---|---|
| 4,597,617 | 7/1986 | Enochs | 439/66 |
| 4,699,593 | 10/1987 | Grabbe et al. | 439/66 |
| 5,061,191 | 10/1991 | Casciotti et al. | 439/66 |
| 5,155,661 | 10/1992 | Nagesh et al. | 361/704 |
| 5,315,481 | 5/1994 | Smolley | 361/707 |

*Primary Examiner*—Gregory D. Thompson
*Attorney, Agent, or Firm*—Leonard A. Alkov; Wanda K. Denson-Low

[57] ABSTRACT

A method of interconnecting a leadless multichip module to a printed wiring board using a solder-free interconnect to form an electronic module. The present invention also contemplates the electronic module produced by the method. The electronic module comprises a printed wiring board having a plurality of interconnect pads, and a leadless multichip module having a base, and a plurality of interconnect pads. The multichip module is disposed in an upside down configuration such that its plurality of interconnect pads face the plurality of interconnect pads of the printed wiring board. A plurality of solder-free interconnects are disposed between the interconnect pads. A nonconductive frame is disposed around the leadless multichip module and is secured to the printed wiring board. The nonconductive frame also secures the multichip module and the plurality of solder-free interconnects to the printed wiring board. This compresses the plurality of solder-free interconnects to cause electrical connection between the interconnect pads. A heat sink is disposed adjacent the base of the leadless multichip module, and is secured to the printed wiring board. A thermal gasket may be disposed between the heat sink and the multichip module, as required.

8 Claims, 2 Drawing Sheets

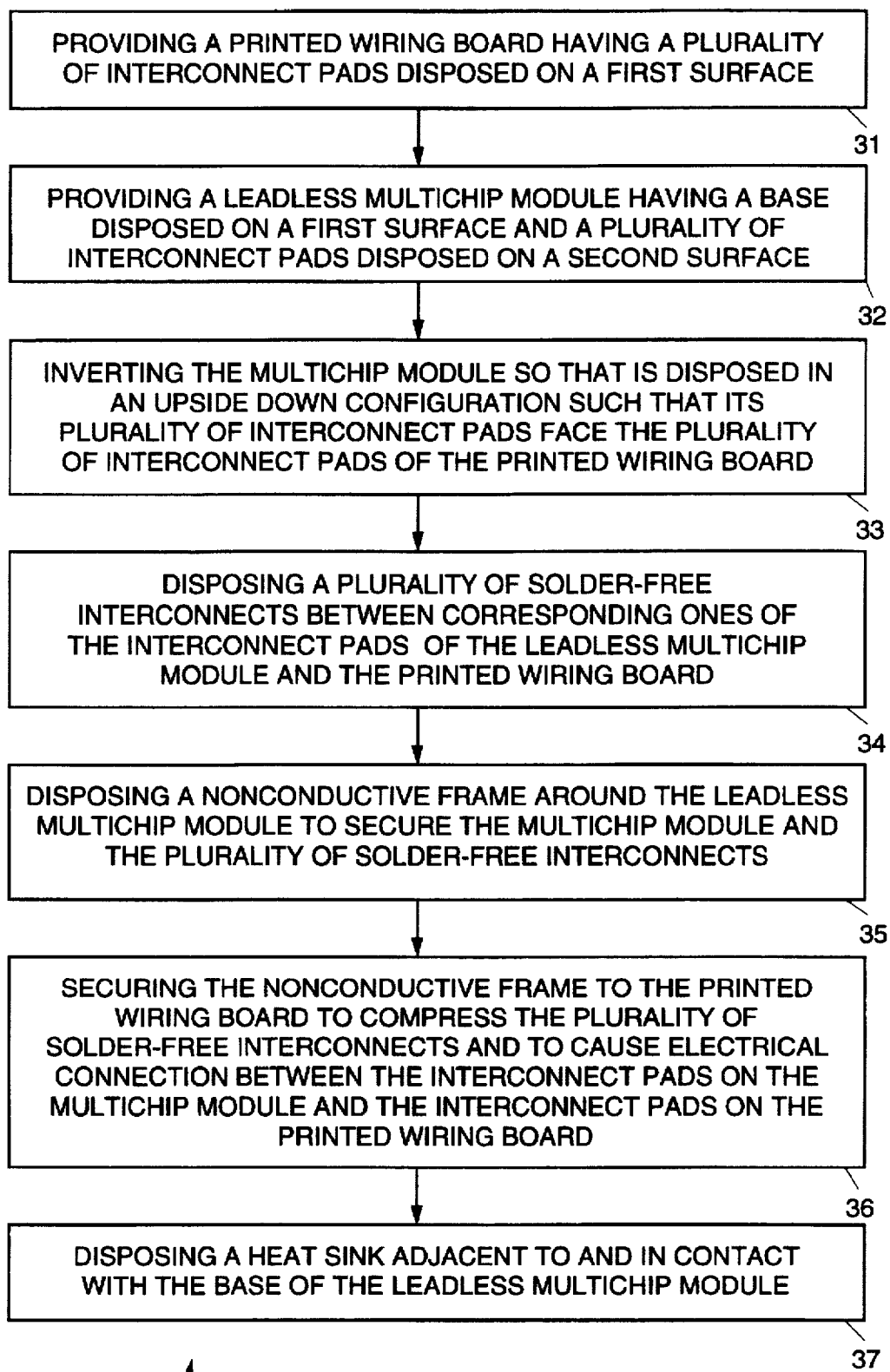

METHOD OF INTERCONNECTING LEADLESS DEVICES TO PRINTED WIRING BOARDS AND APPARATUS PRODUCED THEREBY

BACKGROUND

The present invention relates generally to interconnection of leadless devices to printed wiring boards, and more particularly, to a method of interconnection or mounting leadless devices, such as multichip modules, hybrids, and large packaged components, and the like, to printed wiring boards and apparatus produced by the method.

Generally, prior art relating to the present invention is a traditional leaded component and soldering process. The solder process utilizes environmentally hazardous chemicals, is labor and capital equipment intense, and has questionable reliability. In general, all presently available leadless components such as leadless chip carrier, and ball grid arrays, and the like, achieve electrical connection using soldering, wire bonding or some other similar form of assembly. Traditional modules also mount the printed wiring board directly to a heat sink which forms part of the thermal path. Furthermore, prior art relating to applications of solder free interconnects falls into three categories. These include board to board connectors, test sockets, and component to board interconnects. The component to board interconnect secures the base of a package to a printed wiring board but the package is not upside down. A description of some of the above mentioned prior art is provided in an article by Bruce D. Nordwall entitled "Companies Reduce Solder to Increase Reliability", in Aviation Week & Space Technology, Dec. 6, 1993, pages 50–51.

Accordingly, it is an objective of the present invention to provide for improved method of interconnecting leadless devices, such as multichip modules, hybrids, and large packaged components, and the like, to printed wiring boards and apparatus produced thereby.

SUMMARY OF THE INVENTION

To meet the above and other objectives, the present invention comprises a method of interconnecting leadless devices to printed wiring boards using solder-free interconnects. Interconnection of leadless devices, such as multichip modules, hybrids, and large packaged components, and the like, may be interconnected using the present invention. The present invention also contemplates electronic modules produced by the disclosed method.

The electronic module comprises a printed wiring board having a plurality of interconnect pads, and a leadless multichip module having a base and a plurality of interconnect pads. The multichip module is disposed in an upside down configuration such that its interconnect pads face the interconnect pads of the printed wiring board. A plurality of solder-free interconnects are disposed between the interconnect pads. A nonconductive frame is disposed around the solder-free interconnects and is secured to the printed wiring board. The nonconductive frame also secures the multichip module and the plurality of solder-free interconnects to the printed wiring board. This compresses the plurality of solder-free interconnects to cause electrical connection between the interconnect pads. A heat sink is disposed adjacent the base of the leadless multichip module, and is secured to the printed wiring board. A thermal gasket may be disposed between the heat sink and the multichip module, as required.

The electronic module thus comprises a leadless multichip module interconnected to a printed wiring board using solder-free interconnects. The present invention thus provides for low cost, high reliability, environmentally safe, and easily assembled and repaired electronic modules. The present invention eliminates the use of leads between multichip modules and packaged components and the printed wiring board and replaces them with solder-free interconnect such as fuzz buttons or elastomeric connectors, for example.

The multichip module is thus mounted upside down with the solder-free interconnect disposed between the multichip module and the printed wiring board. The solder-free interconnect is accurately located using the frame. As the multichip module is compressed (screwed down), the solder-free interconnect forms an electrical connection between the pads on the multichip module and the pads on the printed wiring board.

The multichip module and printed wiring board subassembly are then secured to the heat sink. The heat dissipation path for most multichip modules is through the base of the package. Consequently, to maintain thermal performance, the subassembly is mounted inside out such that the base of the multichip module is in direct contact with the heat sink and the printed wiring board are on the outside of the electronic module. The heat sink may be machined to provide relief areas (hogouts) for the multichip module and a thermal gasket may be placed in the relief areas to ensure good thermal contact between the heat sink and the multichip module.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 illustrates a flow chart of one method in accordance with the principles of the present invention.

DETAILED DESCRIPTION

Figure 1:
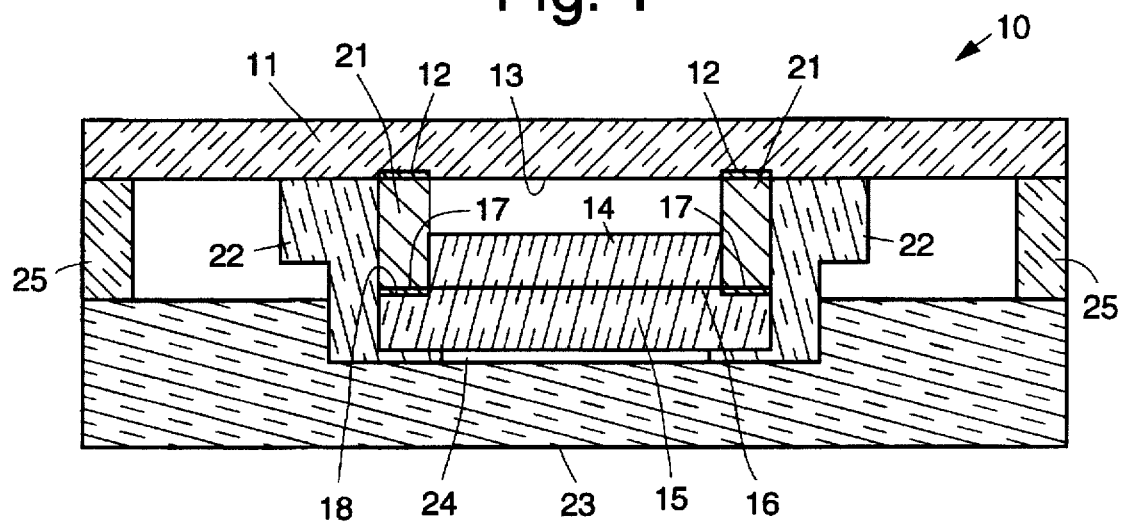
FIG. 1 illustrates a first embodiment of a multichip module package in accordance with the principles of the present invention.
Figure 2:
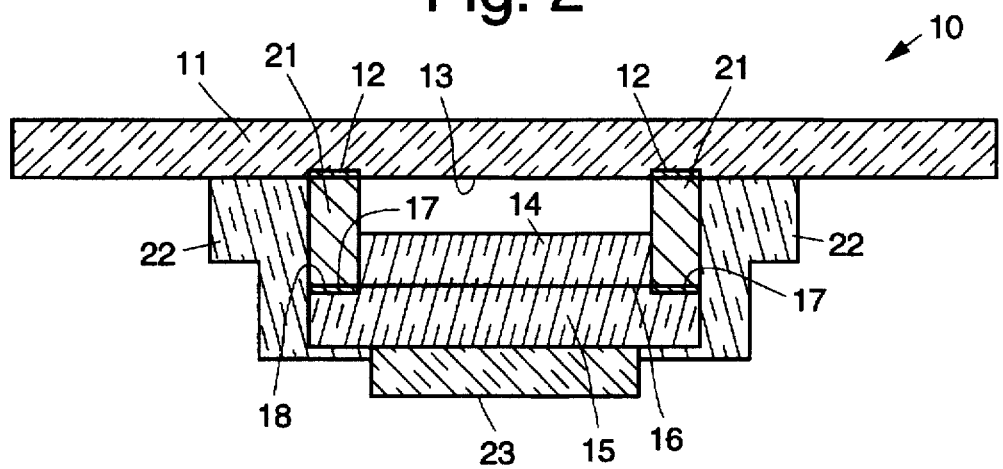
FIG. 2 illustrates a second embodiment of a multichip module package in accordance with the principles of the present invention.

Referring to the drawing figures, FIGS. 1 and 2 illustrate two embodiments of electronic modules 10 made in accordance with the principles of the present invention. FIG. 3 illustrates a flow chart of a method 30 in accordance with the principles of the present invention. Interconnection of leadless devices 14, including multichip modules 14, hybrids, and large packaged components, and the like, may be interconnected using the present invention, although for the purposes of this disclosure, a leadless multichip module 14 is described.

Referring to FIG. 1, the electronic module 10 comprises a printed wiring board 11 having a plurality of interconnect pads 12 disposed on a first surface 13. A leadless device 14 such as a leadless multichip module 14 is provided that has a base 15 that is disposed on a first surface 16 thereof. A plurality of interconnect pads 17 are disposed on a second surface 18 of the leadless device 14 or leadless multichip module 14. The leadless multichip module 14 is disposed in an upside down configuration such that its plurality of interconnect pads 17 face the plurality of interconnect pads 12 of the printed wiring board 11.

A plurality of solder-free interconnects 21 are disposed between corresponding ones of the interconnect pads 17, 12 of the leadless multichip module 14 and the printed wiring board 11. A nonconductive frame 22 is disposed around at least a portion of the periphery of the multichip module 14. The nonconductive frame 22 is secured to the printed wiring board 11 by means of screws, or the like. The nonconductive frame 22 secures the multichip module 14 and the plurality of solder-free interconnects 21 to the printed wiring board 11. This compresses the plurality of solder-free interconnects 21 to cause electrical connection between the interconnect pads 17 on the multichip module 14 and the interconnect pads 12 on the printed wiring board 11.

A heat sink 23 is disposed adjacent the base 15 of the leadless multichip module 14. The heat sink 21 is generally secured to the printed wiring board 11 by means of standoffs 25 and screws, or the like. In the embodiment of FIG. 1, a thermal gasket 24 is disposed between the heat sink 23 and the multichip module 14. Referring to FIG. 2, in this embodiment, no thermal gasket 24 is employed between the heat sink 23 and the multichip module 14. The heat sink 23 comprises a fin-type heat sink 23 which is bonded to the base 15 of the leadless multichip module 14 without the use of a thermal gasket 24 or standoffs 25.

The present invention uses solder-free interconnects 21 such as fuzz buttons 21 or elastomeric connectors 21, or the like, to achieve solderless interconnection of the multichip module 14 to the printed wiring board 11. Elastomeric connectors are available from Elastomeric Technologies Incorporated, while fuzz buttons are available from Cinch Corporation, for example.

With reference to FIG. 3, it shows flow chart illustrating one method 30 in accordance with the principles of the present invention. In accordance with the present method 30, a printed wiring board 11 having a plurality of interconnect pads 12 disposed on a first surface 13 is provided, indicated in step 31. A leadless device 14 such as a leadless multichip module 14 that has a base 15 is provided, indicated in step 32.

The multichip module 14 is turned upside down so that base 15 faces the plurality of interconnect pads 12 of the printed wiring board 11, indicated in step 33. A plurality of solder-free interconnects 21 are then disposed between the multichip module 14 and the printed wiring board 11, indicated in step 34. The solder-free interconnects 21 are accurately located with the frame 22, indicated in step 35, and electrical connection is achieved by compression of the solder-free interconnects 21 by tightening mounting hardware such as screws, or the like, to secure the frame 24 to the printed wiring board 11, indicated in step 36. The subassembly formed by the multichip module 14 and printed wiring board 11 is then mounted inside out such that the base 15 of the multichip module 14 is in contact with the heat sink 23, such that the printed wiring board 11 is on the outside of the electronic module 10, indicated in step 37. The subassembly is then secured to the heat sink 23, such as by screws, or the like, as part of step 37, and therefore no bonding is necessary. The heat sink 23 may be hogged-out and the thermal gasket 24 may be place between the base 15 of the multichip module 14 and the heat sink 24 to ensure good thermal contact.

The present invention thus uses a combination of several aspects to achieve an improved electronic module 10. By mounting the printed wiring board 11 inside out, it is eliminated from the thermal path and the multichip module 14 is in direct contact with the heat sink 23, which is an optimal thermal design. The electronic module 10 may be assembled and unassembled with simple hand tools by tightening nuts and screws; no bonding or soldering is required. The present invention improves the reliability and durability of a multichip module based electronic package 10. At the same time, the present invention improves the environmental greenness of the electronic module 10 and reduces recurring and life cycle costs.

Solder joints are known durability control points as is generally well known in the art. By replacing the solder joints with solder free interconnects 21, the reliability and durability of the electronic module 10 is improved. A correctly designed solder-free interconnect assembly is very reliable. Elimination of the printed wiring board 11 from the heat dissipation path, and directly mounting the base 15 of the multichip module 14 to the heat sink 23 using the thermal gasket 24, for example, improves the thermal performance of the electronic module 10. This results in lower component junction temperatures which is directly related to improved component reliability and design margins. The present invention not only eliminates a durability control point (solder joints) but it also improves thermal performance which results in a two pronged reliability improvement.

Eliminating leads between the multichip module 14 and the printed wiring board 11 avoids potential damage to the leads that result from normal handling. The labor and skill level necessary to assemble the electronic module 10 can be reduced. Bonding of the printed wiring board 11 to the heat sink 23 is eliminated, component preparation (lead forming and trimming) of the leads is eliminated, bonding of the multichip module 14 to the printed wiring board 11 is eliminated, and the soldering process associated with assembling the multichip module 14 is eliminated. All of these factors drastically reduce the recurring cost and life cycle cost of the electronic module 10.

Increasing the number of signals (110) on a multichip module 14 is a potential performance improvement that can be made using the present invention. The maximum number of signals (110) is presently constrained by lead pitch and associated soldering process capability. Also, test access to the package is also indirectly improved since the printed wiring board 11 is now on the outside of the electronic module 10. Access is therefore readily available to all signals by probing of routing vias.

The technology employed in the present invention is immediately applicable and important in reducing cost and improving reliability of multichip module-based electronic modules 10. One impact of the present invention relates to recurring cost savings. Recurring material costs should be about the same. The savings from not having a leaded multichip module are offset by costs of the solder-free interconnects 21. However, the recurring labor cost should be drastically improved. The printed wiring board 11 to heat sink 23 lamination, multichip module lead forming and trimming, multichip module 14 to printed wiring board 11 bonding, and the multichip module soldering processes may be eliminated. This is estimated to provide approximately a 95% savings in the recurring labor costs associated with a multichip module based electronic modules 10. Also, the rework cost associated with removal of multichip modules 14 should be drastically effected since no solder is used.

Thermal problems associated with implementing multichip module technology in impingement cooled systems (VME style modules) are resolved by the present invention. Because the multichip module 14 is mounted upside down using the solder-free interconnect 21 and the heat sink 23 are bonded to the base 15 of the multichip module 11, impingement cooling air flows through the heat sink 23. This solves a thermal problem associated with impingement cooled systems and multichip modules 14.

Thus, a method of interconnecting leadless devices, such as multichip modules, hybrids, and large packaged components, and the like, to printed wiring boards and electronic modules produced by the method have been disclosed. It is to be understood that the described embodiment is merely illustrative of some of the many specific embodiments which represent applications of the principles of the present invention. Clearly, numerous and other arrangements can be readily devised by those skilled in the art without departing from the scope of the invention.

What is claimed is:

1. An electronic module comprising:
   a printed wiring board having a plurality of interconnect pads disposed on a first surface thereof;
   a leadless multichip module having a base and a plurality of interconnect pads that is disposed in an upside down configuration such that its plurality of interconnect pads face the plurality of interconnect pads of the printed wiring board;
   a plurality of solder-free interconnects disposed between corresponding ones of the interconnect pads of the leadless multichip module and the printed wiring board;
   a nonconductive frame disposed around at least a portion of the periphery of the leadless multichip module that secures the multichip module and the plurality of solder-free interconnects and that is secured to the printed wiring board so as to compress the plurality of solder-free interconnects to cause electrical connection between the interconnect pads on the multichip module and the interconnect pads on the printed wiring board; and
   a heat sink disposed adjacent to and in thermal contact with the base of the leadless multichip module.

2. The electronic module of claim 1 which further comprises a thermal gasket disposed between the heat sink and the multichip module.

3. The electronic module of claim 1 wherein the solder-free interconnects comprise fuzz buttons.

4. The electronic module of claim 1 wherein the solder-free interconnects comprise elastomeric connectors.

5. A method of fabricating an electronic module comprising the steps of:
   providing a printed wiring board having a plurality of interconnect pads disposed on a first surface thereof;
   providing a leadless multichip module having a base and a plurality of interconnect pads;
   inverting the multichip module so that is disposed in an upside down configuration such that its plurality of interconnect pads face the plurality of interconnect pads of the printed wiring board;
   disposing a plurality of solder-free interconnects between corresponding ones of the interconnect pads of the leadless multichip module and the printed wiring board;
   disposing a nonconductive frame around at least a portion of the periphery of the leadless multichip module to secure the multichip module and the plurality of solder-free interconnects;
   securing the nonconductive frame to the printed wiring board to compress the plurality of solder-free interconnects and to cause electrical connection between the interconnect pads on the multichip module and the interconnect pads on the printed wiring board; and
   disposing a heat sink adjacent to and in thermal contact with the base of the leadless multichip module.

6. The method of claim 5 which further comprises the step of disposing a thermal gasket between the heat sink and the multichip module.

7. The method of claim 5 wherein the step of disposing the plurality of solder-free interconnects comprises the step of disposing fuzz buttons between corresponding ones of the interconnect pads.

8. The method of claim 5 wherein the step of disposing the plurality of solder-free interconnects comprises the step of disposing elastomeric connectors between corresponding ones of the interconnect pads.

* * * * *